(12) United States Patent
Chae (10) Patent No.: US 9,298,422 B2
(45) Date of Patent: Mar. 29, 2016

(54) NOISE GENERATOR, INTEGRATED CIRCUIT INCLUDING THE SAME, AND OPERATION METHOD THEREOF

(71) Applicant: SK hynix Inc., Gyeonggi-do (KR)

(72) Inventor: Chol Su Chae, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 105 days.

(21) Appl. No.: 14/446,029

(22) Filed: Jul. 29, 2014

(65) Prior Publication Data

US 2015/0331670 A1    Nov. 19, 2015

(30) Foreign Application Priority Data

May 14, 2014   (KR) .................. 10-2014-0057901

(51) Int. Cl.
*G06F 7/58*    (2006.01)
*G06F 11/10*   (2006.01)
*H03M 13/29*   (2006.01)

(52) U.S. Cl.
CPC ...... *G06F 7/58* (2013.01); *G06F 11/10* (2013.01); *H03M 13/2906* (2013.01)

(58) Field of Classification Search
CPC ...... G06F 7/58; G06F 11/10; H03M 13/2906; H03M 13/1137; H03M 13/29; H03M 13/2909; H03M 13/2927; H04L 1/0071
See application file for complete search history.

(56) References Cited

U.S. PATENT DOCUMENTS

| 5,220,568 | A  | * | 6/1993  | Howe ..................... | H03M 5/145 341/59 |
| 7,432,986 | B2 | * | 10/2008 | Winger .................. | H04N 19/61 348/625 |
| 8,078,943 | B1 | * | 12/2011 | Lee ........................ | H03M 13/15 714/781 |
| 8,700,974 | B2 | * | 4/2014  | Chung .................. | G11C 7/1006 714/763 |
| 8,856,428 | B2 | * | 10/2014 | Lee ..................... | G06F 11/1048 711/103 |
| 2007/0290901 | A1 | * | 12/2007 | Hekstra ............ | G11B 20/00086 341/95 |
| 2013/0173989 | A1 | * | 7/2013  | Chung ................. | G11C 7/1006 714/763 |
| 2014/0372714 | A1 | * | 12/2014 | Lee ..................... | G06F 11/1048 711/154 |

FOREIGN PATENT DOCUMENTS

KR    1020050005054    1/2005

* cited by examiner

*Primary Examiner* — Phung M Chung
(74) *Attorney, Agent, or Firm* — IP & T Group LLP (57) ABSTRACT

A noise generator includes a selection unit suitable for outputting first elements corresponding to first seeds based on a first function, and outputting second elements corresponding to second seeds based on a second function, a first permuter suitable for generating first pair elements based on a first correspondence relationship in which the respective first elements and the respective second elements correspond to each other, and a first calculation unit suitable for generating a first noise based on the first pair elements, wherein a product of the first function and the second function is a Gaussian random variable.

20 Claims, 9 Drawing Sheets

NOISE GENERATOR, INTEGRATED CIRCUIT INCLUDING THE SAME, AND OPERATION METHOD THEREOF

CROSS-REFERENCES TO RELATED APPLICATION

The present application claims priority under 35 U.S.C. §119(a) to Korean application number 10-2014-0057901, filed on May 14, 2014, which is incorporated herein by reference in its entirety.

BACKGROUND

1. Technical Field

Various embodiments relate to a noise generator, and more particularly, to a noise generator capable of generating a plurality of noise sets.

2. Related Art

An electrical system or a communication system may operate through inputs of various signals and responses to the inputs. Various signals in a system may include errors, which occur during the transmission thereof, and the errors may cause a malfunction of the system. To prevent errors, various technologies for detecting and correcting errors which occur in signals, are being developed. For example, an error correction code (ECC) unit may be included in a system to perform an error correcting operation. Additionally, test equipment may input errors which are likely to occur into a system, analyze the response of the system to the errors, and thereby test whether or not the system operates normally.

SUMMARY

In an embodiment of the present invention, a noise generator may include: a selection unit suitable for outputting first elements corresponding to first seeds based on a first function, and outputting second elements corresponding to second seeds based on a second function; a first permuter suitable for generating first pair elements based on a first correspondence relationship in which the respective first elements and the respective second elements correspond to each other; and a first calculation unit suitable for generating a first noise based on the first pair elements, wherein a product of the first function and the second function is a Gaussian random variable.

In an embodiment of the present invention, an integrated circuit may include: a first error correction code (ECC) unit suitable for encoding first data to generate a first codeword; and a noise generator suitable for generating a first noise to be inserted in the first codeword. The noise generator may include: a selection unit suitable for outputting first elements corresponding to first seeds based on a first function, and outputting second elements corresponding to second seeds based on a second function; a first permuter suitable for generating first pair elements based on a first correspondence relationship in which the respective first elements and the respective second elements correspond to each other; and a first calculation unit suitable for generating a first noise based on the first pair elements, wherein a product of the first function and the second function is a Gaussian random variable.

In an embodiment of the present invention, a method for operating integrated circuit may include: receiving first seeds and second seeds; outputting first elements corresponding to the first seeds based on a first function, and outputting second elements corresponding to the second seeds based on a second function; generating first pair elements based on a first correspondence relationship in which the respective first elements and the respective second elements correspond to each other; generating a first noise based on the first pair elements; encoding first data to generate a first codeword in which the first noise is inserted; and determining whether an error that occurred in the first codeword is detected and corrected based on the encoded first data.

BRIEF DESCRIPTION OF THE DRAWINGS

Features, aspects, and embodiments are described in conjunction with the attached drawings, in which.

DETAILED DESCRIPTION

Hereinafter, a noise generator and an integrated circuit including the same will be described below with reference to the accompanying drawings through exemplary embodiments.

Figure 1:
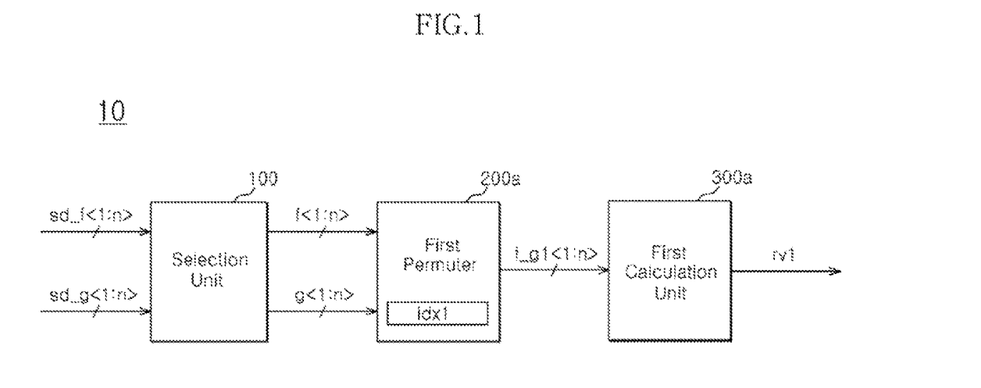
FIG. 1 is a block diagram illustrating a noise generator in accordance with an embodiment of the invention.

FIG. 1 is a block diagram illustrating a noise generator 10 in accordance with an embodiment of the invention.

The noise generator 10 may generate a first noise rv1. The generated first noise rv1 is inputted to an electrical system or a communication system, and may exert an influence on the corresponding system. Various types of noise are likely to be generated in a channel as a path through which a signal such as data is transmitted. The first noise rv1 may be used to observe the reaction of the electrical system or the communication system with respect to noise.

The noise generator 10 may include a selection unit 100, a first permuter 200a, and a first calculation unit 300a.

The selection unit 100 may output first elements f<1:n> corresponding to first seeds sd_f<1:n> on the basis of a first function, and output second elements g<1:n> corresponding to second seeds sd_g<1:n> on the basis of a second function. The product of the first function and the second function may be a Gaussian random variable.

The first permuter 200a may generate first pair elements f_g1<1:n> on the basis of a first correspondence relationship in which the respective first elements f<1:n> and the respective second elements g<1:n> correspond to each other. The first permuter 200a may generate the first pair elements f_g1<1:n> on the basis of a first index set idx1, of which each pair is constituted by a pair of one first element and one second element that correspond to each other. The first correspondence relationship may represent a state in which the first elements f<1:n> and the second elements g<1:n> correspond to each other one-to-one, on the basis of the first index set idx1.

The first calculation unit 300a may generate the first noise rv1 through calculation, on the basis of the first pair elements f_g1<1:n>.

A series of operations, in which the noise generator 10 generates the first noise rv1 on the basis of the first seeds sd_f<1:n> and the second seeds sd_g<1:n> inputted, may be defined as a noise generating operation at one time. The noise generator 10 may be inputted with different first seeds sd_f<1:n> and different second seeds sd_g<1:n> in respective noise generating operations, and may generate different first noises on all such occasions. The different first noises may form a first noise set. The first noise set formed may have a Gaussian distribution characteristic. The noise generator 10 may generate an additive white Gaussian noise (AWGN).

Figure 2:
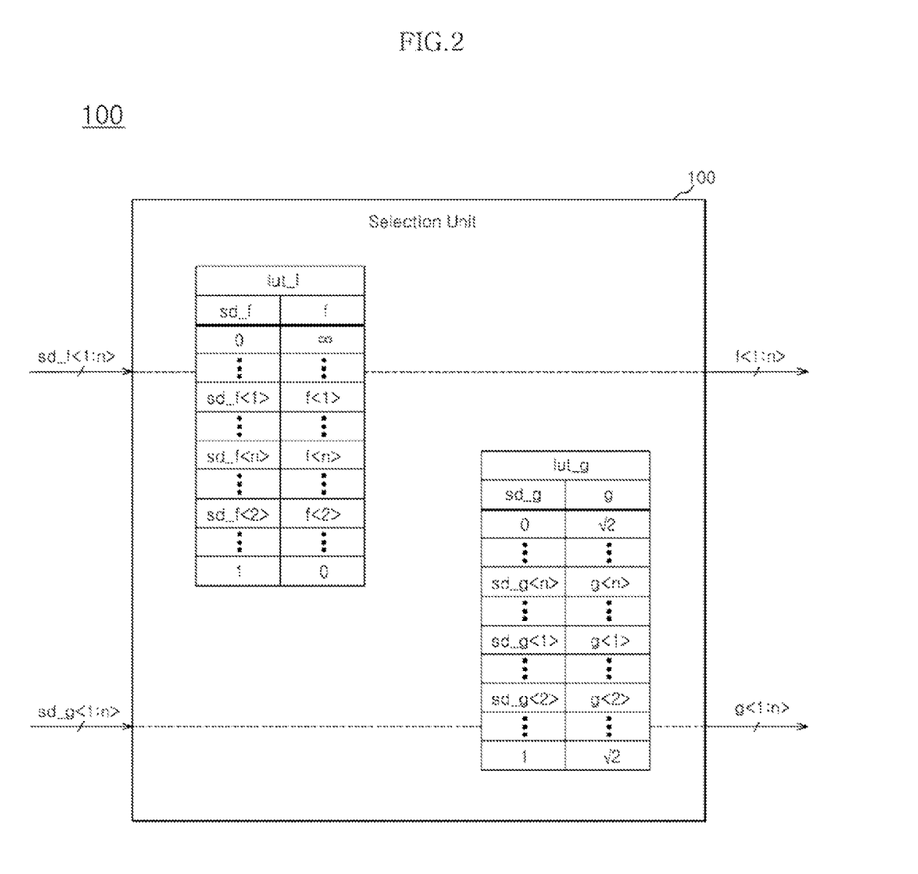
FIG. 2 is a diagram illustrating an operation of a selection unit shown in FIG. 1.

FIG. 2 is a diagram for describing the operation of the selection unit 100 shown in FIG. 1. Referring to FIG. 2, there is shown the selection unit 100, which includes a first table lut_f based on the first function and a second table lut_g based on the second function.

The product of the first function for generating the first elements f<1:n> from the first seeds sd_f<1:n> and the second function for generating the second elements g<1:n> from the second seeds sd_g<1:n> may be the Gaussian random variable. That is, the first function and the second function may be factors of the Gaussian random variable. For example, the first function and the second function may be factors which are acquired on the basis of a Box-Muller method for generating a Gaussian random variable. Relationships, such as, when the product of a first function f and a second function g is a Gaussian random variable rv, may be expressed as in the following equations.

$$rv = f(sd\_f) * g(sd\_g)$$

$$f(sd\_f) = \sqrt{(-\ln(sd\_f))}$$

$$g(sd\_g) = \sqrt{(2)} * \cos(2\pi * (sd\_g))$$

Referring to the above equations, the first function f(sd_f) may be the function of the first seed sd_f. The second function g(sd_g) may be the function of the second seed sd_g.

Referring to FIG. 2, the selection unit 100 may be inputted with the first seeds sd_f<1:n> and the second seeds sd_g<1:n>. The first seeds sd_f<1:n> and the second seeds sd_g<1:n> may be selected as uniform random variables which are independent of each other, within the range of [0,1].

The selection unit 100 may output the first elements f<1:n> respectively corresponding to the first seeds sd_f<1:n>, based on the first function. The selection unit 100 may output values which are acquired by substituting the respective first seeds sd_f<1:n> into the equation f=√(−ln(sd_f)) of the first function, as the first elements f<1:n>. For example, the selection unit 100 may output the first elements f<1:n> by referring to the first table lut_f which is based on the first function.

The first table lut_f may include information on values which are acquired by substituting values capable of being inputted as the first seeds sd_f within the range of [0,1], into the equation of the first function, that is, information on the first elements f. For example, in the first table lut_f, if the first seed sd_f is inputted as 0, the first element f corresponding thereto may be a value which diverges infinitely, on the basis of the first function. In the first table lut_f, if the first seed sd_f is inputted as 1, the first element f corresponding thereto may be 0 on the basis of the first function. The first table lut_f may include information on the first elements f<1:n> respectively corresponding to the inputted first seeds sd_f<1:n>.

The selection unit 100 may output the second elements g<1:n> respectively corresponding to the second seeds sd_g<1:n>, based on the second function. The selection unit 100 may output values which are acquired by substituting the respective second seeds sd_g<1:n> into the equation g=√(2)*cos(2π*(sd_g)) of the second function, as the second elements g<1:n>. For example, the selection unit 100 may output the second elements g<1:n> by referring to the second table lut_g which is based on the second function.

The second table lut_g may include information on values which are acquired by substituting values capable of being inputted as the second seeds sd_g within the range of [0,1], into the equation of the second function, that is, information on the second elements g. For example, in the second table lut_g, if the second seed sd_g is inputted as 0, the second element g corresponding thereto may be √2 on the basis of the first function. In the second table lut_g, if the second seed sd_g is inputted as 1, the second element g corresponding thereto may be √2 on the basis of the first function. The second table lut_g may include information on the second elements g<1:n> respectively corresponding to the inputted second seeds sd_g<1:n>.

Figure 3:
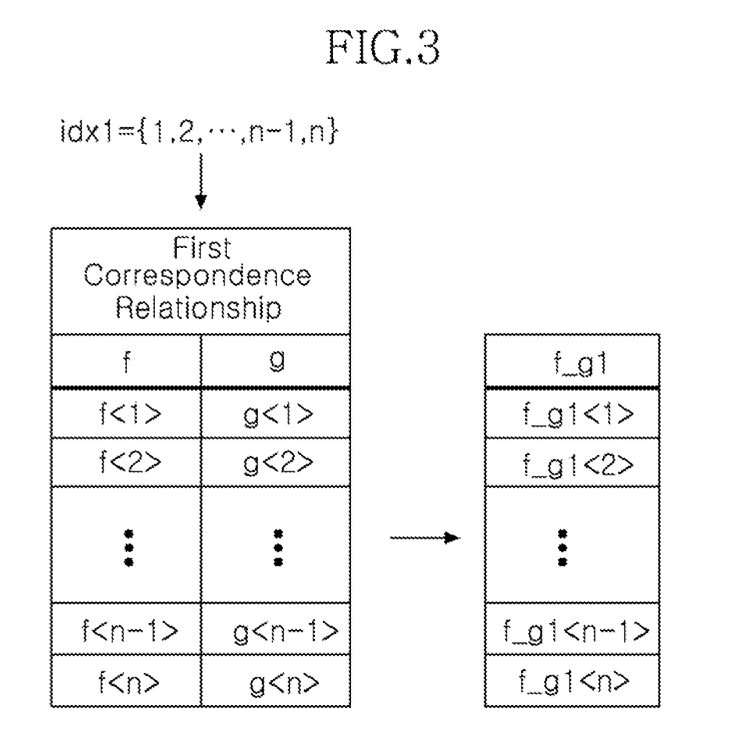
FIG. 3 is a diagram illustrating an operation of a first permuter shown in FIG. 1.

FIG. 3 is a diagram for describing an operation method of the first permuter 200a shown in FIG. 1. Referring to FIG. 3, there are shown the first elements f<1:n> and the second elements g<1:n> which are aligned in the first correspondence relationship, and the first pair elements f_g1<1:n>.

The first permuter 200a may set the first elements f<1:n> and the second elements g<1:n> which are outputted from the selection unit 100, in the first correspondence relationship. The first correspondence relationship may be a state in which the first elements f<1:n> and the second elements g<1:n> correspond to each other one-to-one on the basis of the first index set idx1. For example, the first element f<1> may correspond to the second elements g<1>. The first element f<n> may correspond to the second elements g<n>.

An index set may be a set in which the indexes of the respective second elements g<1:n> corresponding to the respective first elements f<1:n> are listed. The index set may represent an index arrangement of the second elements g<1:n> corresponding to an index arrangement in which the first elements f<1:n> are sequentially fixed. For example, the first index set idx1 may mean the index arrangement {1, 2, ..., n−1, n} of the second elements g<1:n> corresponding to the sequential index arrangement {1, 2, ..., n−1, n} of the first elements f<1:n>.

Referring to FIG. 3, the first permuter 200a may generate the first pair elements f_g1<1:n> each constituted by the pair of one first element f and one second element g corresponding to each other, on the basis of the first correspondence relationship. For example, the first pair element f_g1<1> may be constituted by the first element f<1> and the second element g<1> corresponding to each other. The first pair elements f_g1<1:n> generated may be provided to the first calculation unit 300a.

Figure 4:
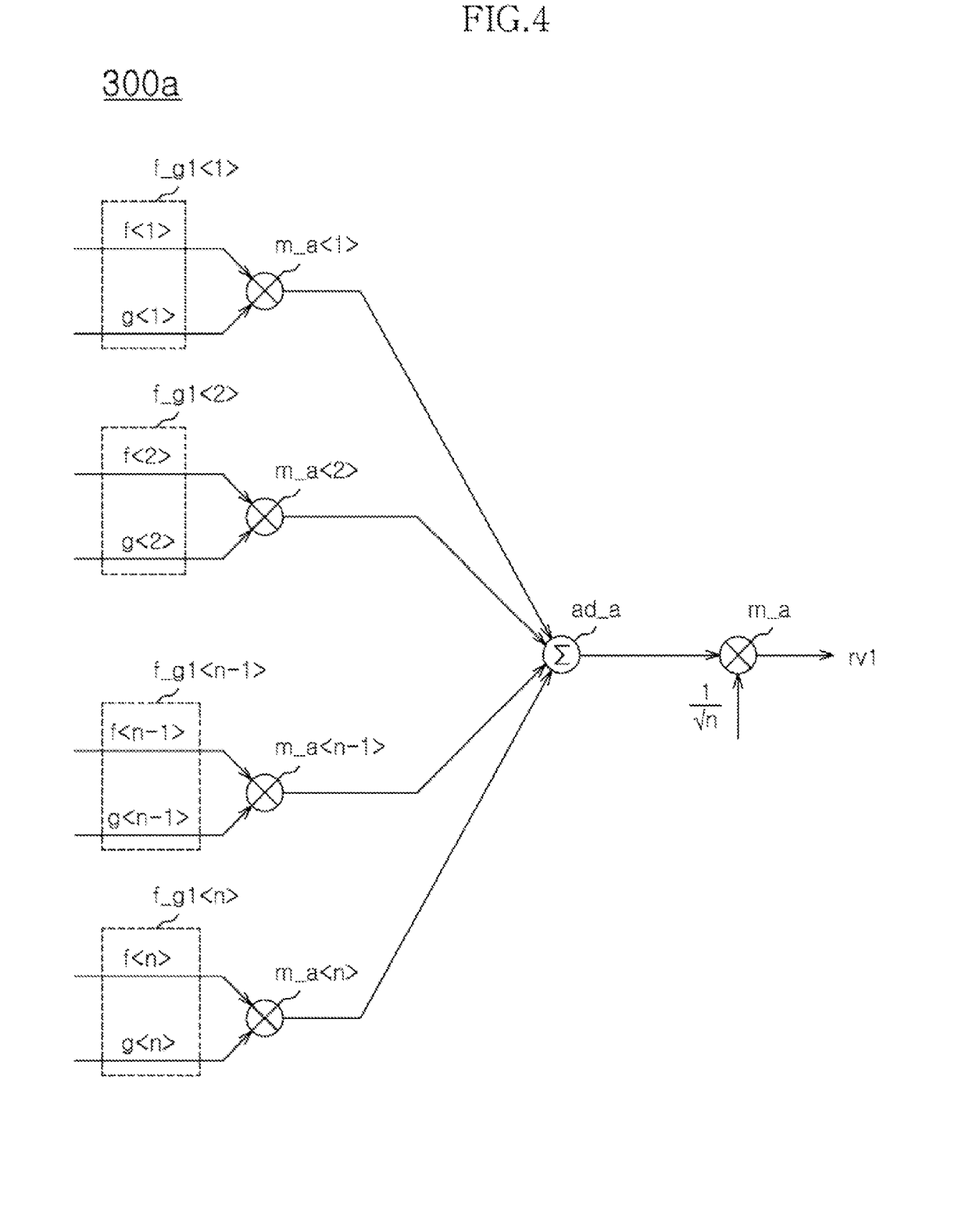
FIG. 4 is a detailed diagram illustrating a first calculation unit shown in FIG. 1.

FIG. 4 is a detailed diagram of the first calculation unit 300a shown in FIG. 1.

The products of the first elements f and the second elements g which constitute the respective first pair elements f_g1<1:n> outputted from the first permuter 200a may have the Gaussian distribution characteristic according to the characteristics of the first function and the second function which were described with reference to the above equations. The first calculation unit 300a may perform calculations according to the central limit theorem for the products of the first elements f and the second elements g, and may generate the first noise rv1 which has a further improved Gaussian distribution characteristic.

Referring to FIG. 4, the first calculation unit 300a may generate the first noise rv1 through calculation based on the first pair elements f_g1<1:n>. The first calculation unit 300a may include multipliers m_a<1:n> and m_a, and an adder ad_a. The multipliers m_a<1:n> may multiply the first elements f and the second elements g which correspond to each other and constitute the respective first pair elements f_g1<1:n>. The adder ad_a may add multiplication results, and the multiplier m_a may multiply an adding result and $1/\sqrt{n}$. The first calculation unit 300a may output the output of the multiplier m_a as the first noise rv1.

Figure 5:
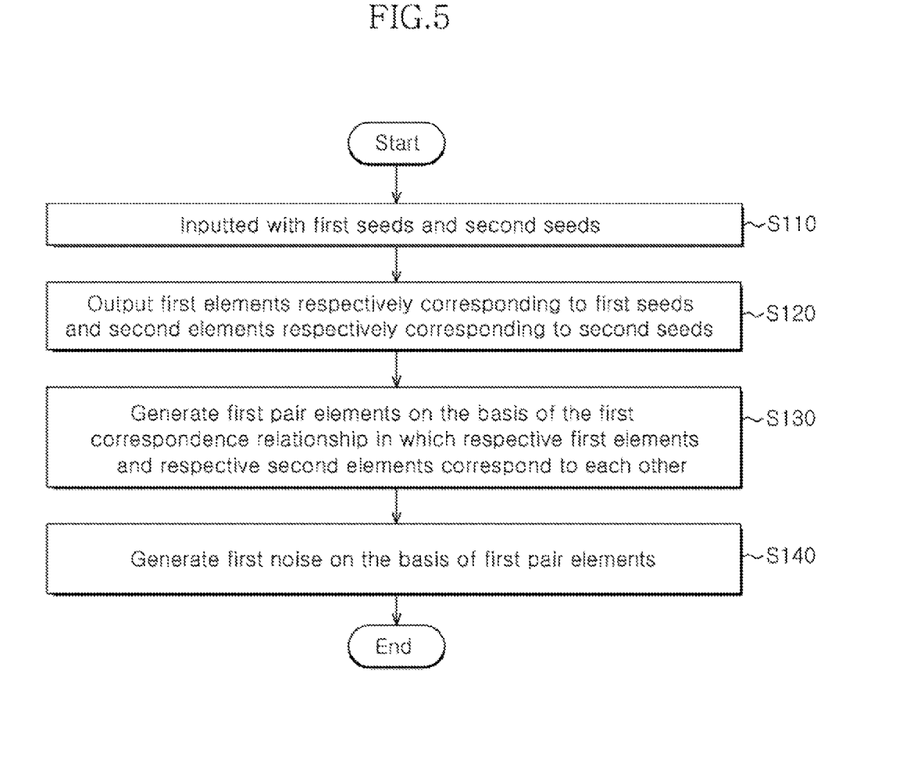
FIG. 5 is a flow chart illustrating an operation method of the noise generator shown in FIG. 1.

FIG. 5 is a flow chart for describing an operation method of the noise generator 10 shown in FIG. 1.

Hereinafter, the operation method of the noise generator 10 will be described in detail with reference to FIGS. 1 to 5.

In step S110, the selection unit 100 may be inputted with the first seeds sd_f<1:n> and the second seeds sd_g<1:n>. The first seeds sd_f<1:n> and the second seeds sd_g<1:n> may be selected as the uniform random variables which are independent of each other, within the range of [0,1].

In step S120, the selection unit 100 may output the first elements f<1:n> respectively corresponding to the first seeds sd_f<1:n>, by referring to the first table lut_f, and may output the second elements g<1:n> respectively corresponding to the second seeds sd_g<1:n>, by referring to the second table lut_g.

In step S130, the first permuter 200a may generate the first pair elements f_g1<1:n> on the basis of the first correspondence relationship in which the respective first elements f<1:n> and the respective second elements g<1:n> correspond to each other.

In step S140, the first calculation unit 300a may generate the first noise rv1 on the basis of the first pair elements f_g1<1:n>. The first calculation unit 300a may perform calculations according to the central limit theorem, and may generate the first noise rv1 which has the further improved Gaussian distribution characteristic.

Figure 6:
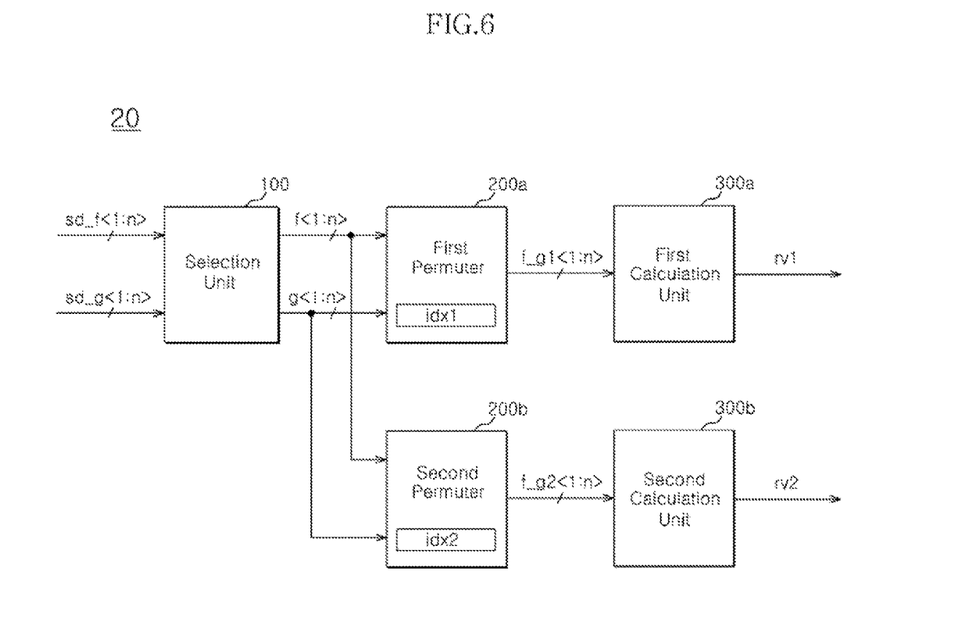
FIG. 6 is a block diagram illustrating a noise generator in accordance with an embodiment of the invention.

FIG. 6 is a block diagram illustrating a noise generator 20 in accordance with an embodiment of the invention. In FIG. 6, the same reference numerals as in FIG. 1 will be used to refer to component elements substantially the same as the component elements of the noise generator 10 of FIG. 1, and the detailed descriptions for corresponding component elements will be omitted.

The noise generator 20 may include a selection unit 100, a first permuter 200a, a first calculation unit 300a, a second permuter 200b, and a second calculation unit 300b.

The second permuter 200b may generate second pair elements f_g2<1:n> on the basis of a second correspondence relationship in which the respective first elements f<1:n> and the respective second elements g<1:n> correspond to each other. The second permuter 200b may generate the second pair elements f_g2<1:n> each constituted by the pair of one first element and one second element corresponding to each other, on the basis of a second index set idx2. The second correspondence relationship may be a state in which the first elements f<1:n> correspond one-to-one to the second elements g<1:n>, on the basis of the second index set idx2.

A second calculation unit 300b may generate a second noise rv2 through calculation, on the basis of the second pair elements f_g2<1:n>.

Since the first index set idx1 and the second index set idx2 may be different from each other, the first correspondence relationship formed by the first permuter 200a and the second correspondence relationship formed by the second permuter 200b may be different from each other. Accordingly, the first permuter 200a and the second permuter 200b may generate the first pair elements f_g1<1:n> and the second pair elements f_g2<1:n> to be different from each other, and the first calculation unit 300a and the second calculation unit 300b also may generate the first noise rv1 and the second noise rv2 to be different from each other.

The noise generator 20 may simultaneously generate the first noise rv1 and the second noise rv2 which are different from each other, through a noise generating operation of one time. The noise generator 20 may be inputted with different first seeds sd_f<1:n> and different second seeds sd_g<1:n> in respective noise generating operations, and may generate different first noises, that is, a first noise set, and at the same time, may generate different second noises, that is, a second noise set, on all such occasions. Each of the first noise set and the second noise set generated may have a Gaussian distribution characteristic.

Although it is shown in FIG. 6 that the noise generator 20 includes two permuters 200a and 200b and two calculation units 300a and 300b, it is to be noted that a noise generator may include at least three permuters and at least three calculation units according to an embodiment of the invention. That is, the noise generator may generate at least three noises in the noise generating operation of each time.

Figure 7:
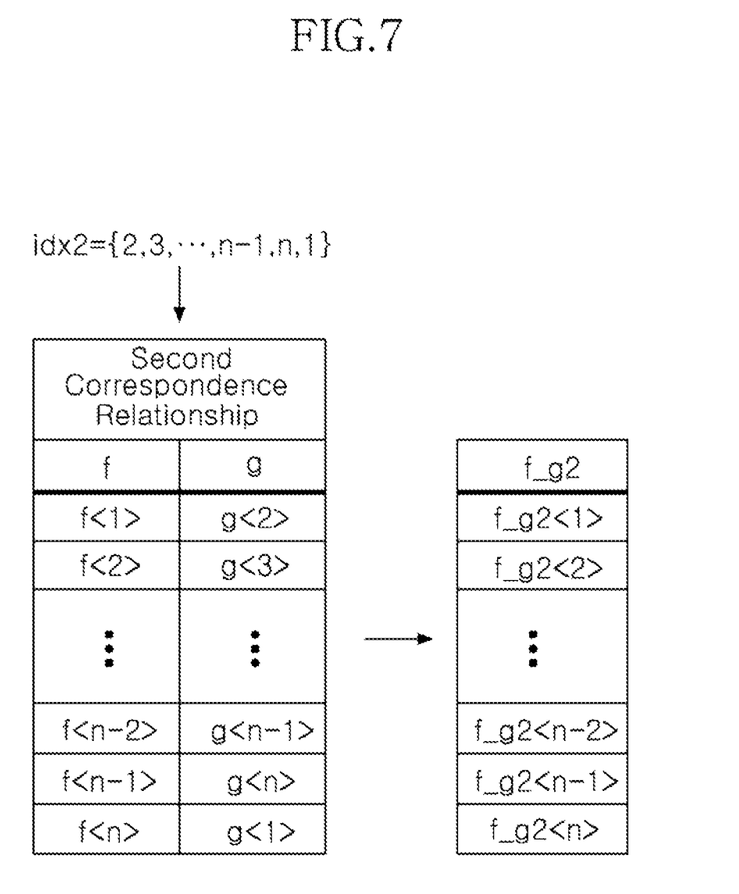
FIG. 7 is a diagram illustrating an operation of a second permuter shown in FIG. 6.

FIG. 7 is a diagram for describing an operation of the second permuter 200b shown in FIG. 6. Referring to FIG. 7, there are shown the first elements f<1:n> and the second elements g<1:n> which are aligned in the second correspondence relationship, and the second pair elements f_g2<1:n>.

The second permuter 200b may have substantially the same configuration and may operate in the same manner when compared to the first permuter 200a, except that reference is made to the second index set idx2. The second permuter 200b may set the first elements f<1:n> and the second elements g<1:n> which are outputted from the selection unit 100, in the second correspondence relationship which is different with the first correspondence relationship of FIG. 3, on the basis of the second index set idx2. In the second correspondence relationship, for example, the first element f<1> may correspond to the second element g<2> and the first element f<n> may correspond to the second element g<1>.

As defined above, an index set may represent the index arrangement of the second elements g<1:n> corresponding to the sequentially fixed index arrangement of the first elements f<1:n>. For example, the second index set idx2 may mean the index arrangement {2, 3, . . . , n−1, n, 1} of the second elements g<1:n> corresponding to the sequential index arrangement {1, 2, . . . , n−2, n−1, n} of the first elements f<1:n>.

Referring to FIG. 7, the second permuter 200b may generate the second pair elements f_g2<1:n> each of which is constituted by a pair of one first element f and one second element g corresponding to each other, on the basis of the second correspondence relationship. For example, the second pair elements f_g2<1> may be constituted by the first elements f<1> and the second elements g<2> corresponding to each other. The second pair elements f_g2<1:n> generated may be provided to the second calculation unit 300b.

Figure 8:
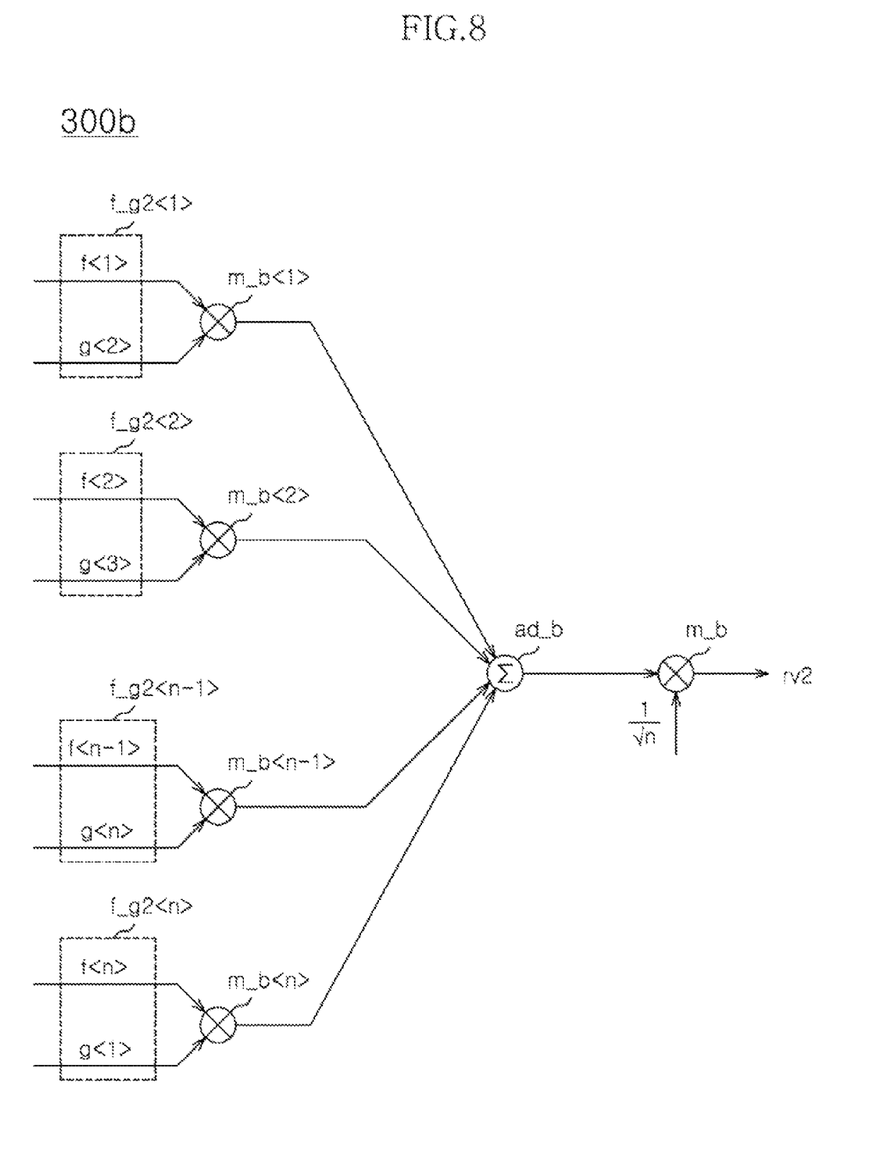
FIG. 8 is a detailed diagram illustrating a second calculation unit shown in FIG. 6.

FIG. 8 is a detailed diagram of the second calculation unit 300b shown in FIG. 6.

The second calculation unit 300b may have substantially the same configuration and may operate in the same manner when compared to the first calculation unit 300a. The second calculation unit 300b may generate the second noise rv2 through calculation on the basis of the second pair elements f_g2<1:n>. The second calculation unit 300b may include multipliers m_b<1:n> and m_b and an adder ad_b.

Figure 9:
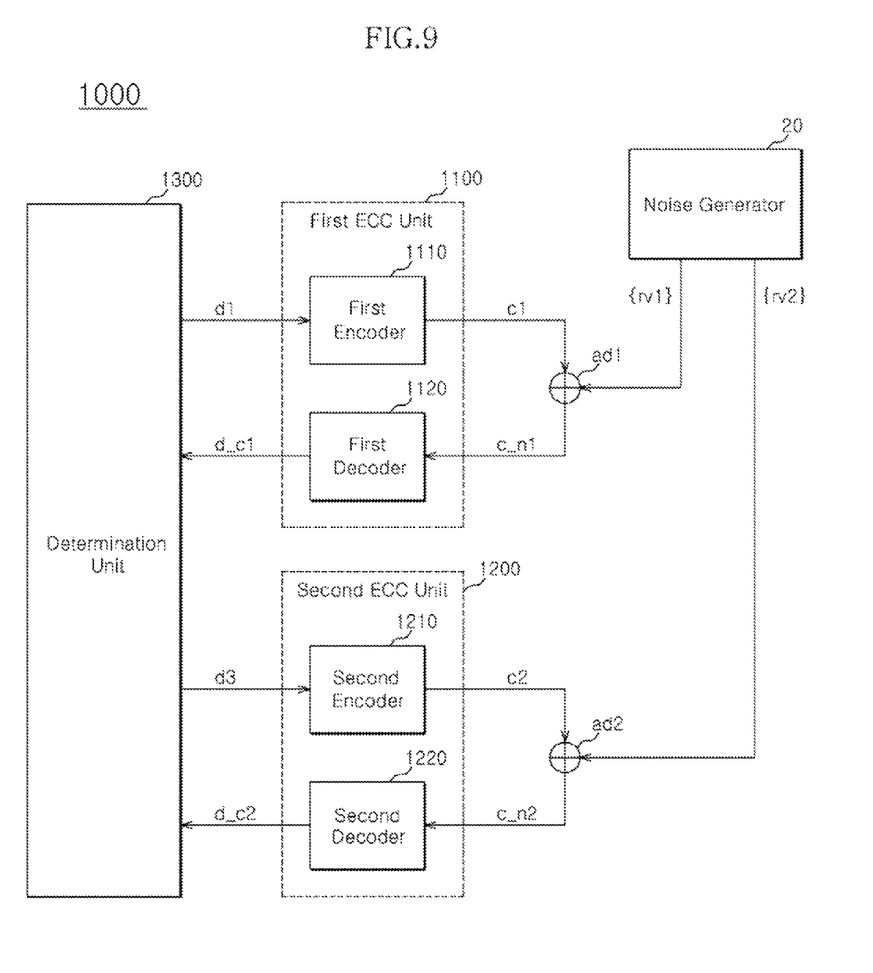
FIG. 9 is a block diagram illustrating an integrated circuit in accordance with an embodiment of the invention.

FIG. 9 is a block diagram illustrating an integrated circuit 1000 in accordance with an embodiment of the invention.

The integrated circuit 1000 may include a first ECC unit 1100, a second ECC unit 1200, the noise generator 20, and a determination unit 1300.

The first ECC unit 1100 may perform an error correcting operation of detecting and correcting an error that occurred in data d1. The first ECC unit 1100 may include a first encoder 1110 and a first decoder 1120.

The first encoder 1110 may encode the data d1 such that an error, which is likely to subsequently occur in the data d1 that is inputted, may be detected and corrected. In encoding, the first encoder 1110 may generate the parity data of the data d1 and may generate a first codeword c1 by adding the generated parity data to the data d1.

The first decoder 1120 may detect and correct the error of an error generation codeword c_n1 in which a first noise set {rv1} is inserted in the first codeword c1 as a noise. The first decoder 1120 may decode the error-corrected first codeword to original data d_c1 before encoding, and may output the original data d_c1.

The second ECC unit 1200 may include a second encoder 1210 and a second decoder 1220. Since the configurations and operation methods of the second encoder 1210 and the second decoder 1220 may be substantially the same as the configurations and operation methods of the first encoder 1110 and the first decoder 1120, the detailed descriptions thereof will be omitted.

The configuration and operation method of the noise generator 20 may be substantially the same as the configuration and operation method of the noise generator 20 shown in FIG. 6. The noise generator 20 may generate and output a first noise set {rv1} and a second noise set {rv2} which have Gaussian distribution characteristics. The first noise set {rv1} may be inserted as a noise, that is, an error, in the first codeword c1 outputted from the first encoder 1110, through an adder ad1. The second noise set {rv2} may be inserted as a noise, that is, an error, in a second codeword c2 outputted from the second encoder 1210, through an adder ad2.

The noise generator 20 may generate the first and second noise sets {rv1} and {rv2} in parallel. The simultaneously generated first and second noise sets {rv1} and {rv2} may be inserted substantially simultaneously in the first and second codewords c1 and c2, respectively, as errors. The respective first and second ECC units 1100 and 1200 may perform substantially simultaneously the error correcting operations.

The determination unit 1300 may determine whether the first ECC unit 1100 and the second ECC unit 1200 operate normally. That is, the determination unit 1300 may determine whether the first decoder 1120 and the second decoder 1220 have properly detected and corrected errors which occurred in the codewords c1 and c2. For example, the determination unit 1300 may test the performance of the first ECC unit 1100 and the second ECC unit 1200 through reference and comparison of the data d1, d_c1, d2 and d_c2 inputted to and outputted from the first ECC unit 1100 and the second ECC unit 1200. When the first ECC unit 1100 and the second ECC unit 1200 substantially simultaneously perform the error correcting operations, the determination unit 1300 may substantially simultaneously test the performance of the respective first and second ECC units 1100 and 1200.

Since the integrated circuit 1000 according to the embodiment of the invention may substantially simultaneously test the performance of a plurality of respective ECC units, a testing time may be shortened.

While certain embodiments have been described above, it will be understood to those skilled in the art that the embodiments described are by way of example only. Accordingly, the noise generator and the integrated circuit including the same described herein should not be limited based on the described embodiments. Rather, the noise generator and the integrated circuit including the same described herein should only be limited in light of the claims that follow when taken in conjunction with the above description and accompanying drawings.

What is claimed is:

1. A noise generator comprising:
   a selection unit suitable for outputting first elements corresponding to first seeds based on a first function, and outputting second elements corresponding to second seeds based on a second function;
   a first permuter suitable for generating first pair elements based on a first correspondence relationship in which the respective first elements and the respective second elements correspond to each other; and
   a first calculation unit suitable for generating a first noise based on the first pair elements,
   wherein a product of the first function and the second function is a Gaussian random variable.

2. The noise generator according to claim 1, wherein the first permuter generates the first pair elements, each of which includes a pair of a first element and a corresponding second element, based on a first index set.

3. The noise generator according to claim 1, wherein the selection unit refers to a first table, which includes information on a correspondence relationship of the first seeds and the first elements, and a second table, which includes information on a correspondence relationship of the second seeds and the second elements.

4. The noise generator according to claim 1, further comprising:
   a second permuter suitable for generating second pair elements based on a second correspondence relationship in which the respective first elements and the respective second elements correspond to each other.

5. The noise generator according to claim 4, wherein the first correspondence relationship and the second correspondence relationship are different from each other.

6. The noise generator according to claim 5, further comprising:
   a second calculation unit suitable for generating a second noise based on the second pair elements.

7. The noise generator according to claim 4, wherein the second permuter generates the second pair elements, each of which includes a pair of a first element and a corresponding second element, based on a second index set.

8. An integrated circuit, comprising:
   a first error correction code (ECC) unit suitable for encoding first data to generate a first codeword; and
   a noise generator suitable for generating a first noise to be inserted in the first codeword,
   the noise generator comprising:
   a selection unit suitable for outputting first elements corresponding to first seeds based on a first function, and outputting second elements corresponding to second seeds based on a second function;
   a first permuter suitable for generating first pair elements based on a first correspondence relationship in which the respective first elements and the respective second elements correspond to each other; and
   a first calculation unit suitable for generating the first noise based on the first pair elements,
   wherein a product of the first function and the second function is a Gaussian random variable.

9. The integrated circuit according to claim 8, further comprising:
a determination unit suitable for determining whether the first ECC unit detected and corrected an error that occurred in the first codeword.

10. The Integrated circuit according to claim 8, wherein the first permuter generates the first pair elements, each of which includes a pair of a first element and a corresponding second element, based on a first index set.

11. The integrated circuit according to claim 8, wherein the selection unit refers to a first table, which includes information on a correspondence relationship of the first seeds and the first elements, and a second table, which includes information on a correspondence relationship of the second seeds and the second elements.

12. The integrated circuit according to claim 8, wherein the noise generator further comprises:
a second permuter suitable for generating second pair elements based on a second correspondence relationship in which the respective first elements and the respective second elements correspond to each other.

13. The integrated circuit according to claim 12, wherein the first correspondence relationship and the second correspondence relationship are different from each other.

14. The integrated circuit according to claim 12, wherein the second permuter generates the second pair elements, each of which includes a pair of a first element and a corresponding second element, based on a second index set.

15. The integrated circuit according to claim 12, wherein the noise generator further comprises:
a second calculation unit suitable for generating a second noise based on the second pair elements.

16. The integrated circuit according to claim 15, further comprising:
a second ECC unit suitable for encoding second data to generate a second codeword,
wherein the second noise is to be inserted in the second codeword.

17. The integrated circuit according to claim 16,
wherein the noise generator generates the first and second noises in parallel,
wherein the respective first and second noises are substantially simultaneously inserted in the respective first and second codewords, and
wherein the first and second ECC units substantially simultaneously perform error correcting operations.

18. A method for operating an integrated circuit, the method comprising:
receiving first seeds and second seeds;
outputting first elements corresponding to the first seeds based on a first function, and outputting second elements corresponding to the second seeds based on a second function;
generating first pair elements based on a first correspondence relationship in which the respective first elements and the respective second elements correspond to each other;
generating a first noise based on the first pair elements;
encoding first data to generate a first codeword in which the first noise is inserted; and
determining whether an error that occurred in the first codeword is detected and corrected based on the encoded first data.

19. The method according to claim 18, wherein a product of the first function and the second function is a Gaussian random variable.

20. The method according to claim 18, further comprising:
generating a second noise;
encoding second data to generate a second codeword in which the second noise is inserted; and
determining whether an error that occurred in the second codeword is detected and corrected based on the encoded second data.

* * * * *